(12) United States Patent
Chelstrom et al.

(10) Patent No.: US 7,500,164 B2
(45) Date of Patent: Mar. 3, 2009

(54) METHOD FOR TESTING AN INTEGRATED CIRCUIT DEVICE HAVING ELEMENTS WITH ASYNCHRONOUS CLOCKS OR DISSIMILAR DESIGN METHODOLOGIES

(75) Inventors: Nathan P. Chelstrom, Cedar Park, TX (US); Steven R. Ferguson, Granite Shoals, TX (US); Mack W. Riley, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 278 days.

(21) Appl. No.: 11/421,515

(22) Filed: Jun. 1, 2006

(65) Prior Publication Data

US 2007/0283205 A1 Dec. 6, 2007

(51) Int. Cl.
*G01R 31/28* (2006.01)
(52) U.S. Cl. .......................... 714/729; 714/724; 714/30; 714/726; 714/727; 714/732
(58) Field of Classification Search ........................ None
See application file for complete search history.

(56) References Cited

U.S. PATENT DOCUMENTS

| | | | | |
|---|---|---|---|---|
| 5,132,635 | A * | 7/1992 | Kennedy | 324/763 |
| 5,621,739 | A * | 4/1997 | Sine et al. | 714/724 |
| 6,131,173 | A * | 10/2000 | Meirlevede et al. | 714/726 |
| 6,247,107 | B1 * | 6/2001 | Christie | 711/216 |
| 6,327,684 | B1 | 12/2001 | Nadeau-Dostie et al. | |
| 6,442,722 | B1 * | 8/2002 | Nadeau-Dostie et al. | 714/731 |
| 6,826,100 | B2 * | 11/2004 | Ellis et al. | 365/201 |
| 7,007,213 | B2 * | 2/2006 | Wang et al. | 714/729 |
| 7,134,056 | B2 * | 11/2006 | Kleveland et al. | 714/704 |
| 7,260,756 | B1 * | 8/2007 | Wang et al. | 714/729 |
| 2002/0087932 | A1 * | 7/2002 | Ojha et al. | 714/739 |
| 2002/0120896 | A1 * | 8/2002 | Wang et al. | 714/731 |
| 2005/0166104 | A1 | 7/2005 | Rich et al. | |
| 2007/0255988 | A1 * | 11/2007 | Wang et al. | 714/726 |

OTHER PUBLICATIONS

U.S. Appl. No. 11/380,677, filed Apr. 28, 2006, Chelstrom et al.
Hetherington et al., "Logic BIST for Large Industrial Designs: Real Issues and Case Studies", International Test Conference 1999, ITC'99, Atlantic City, NJ, XP000928853, Sep. 28-30, 1999, pp. 358-367.

* cited by examiner

*Primary Examiner*—John P Trimmings
(74) *Attorney, Agent, or Firm*—Stephen R. Tkacs; Stephen J. Walder, Jr.; Matthew B. Talpis

(57) ABSTRACT

A method for testing an integrated circuit device with asynchronous clocks or dissimilar design methodologies is provided. With the method, each clock domain has its own scan paths that do not cross domain boundaries. By eliminating the scanning across the boundaries, the requirement to have two clock grids in the asynchronously clocked domains may be eliminated. As a result, circuit area and design time with regard to the clock distribution design are reduced. In addition, removing the second clock grid, i.e. the high speed core or system clock, in the asynchronously clocked domains removes the requirement to have a multiplexing scheme for selection of clocking signals in the asynchronous domain. In addition to the above, the method provides boundary built-in-self-test logic for testing the functional crossing logic of boundaries between the clock domains in a functional mode of operation.

1 Claim, 5 Drawing Sheets

METHOD FOR TESTING AN INTEGRATED CIRCUIT DEVICE HAVING ELEMENTS WITH ASYNCHRONOUS CLOCKS OR DISSIMILAR DESIGN METHODOLOGIES

BACKGROUND

1. Technical Field

The present application relates generally to an improved data processing system and method. More specifically, the present application is directed to a system and method for testing an integrated circuit device with asynchronous clocks or dissimilar design methodologies.

2. Description of Related Art

When a microprocessor or system-on-a-chip (SoC) is designed, it is important that the resulting chip design be tested to ensure proper functioning. In order to test a microprocessor or SoC chip, typically, the chip is designed to include built-in scan chains for scanning in test patterns to individually test the cores and other circuitry elements of the microprocessor or SoC. A scan chain is formed by connecting a set of sequential elements, such as flip-flops or shift register latches, as a shift register chain in a processor or SoC design. Most modern processor or SoC chips have multiple scan chains to reduce testing application time and testing cost.

Highly integrated microprocessor and SoC designs contain many different functional elements. Some of these functional chip elements may be asynchronously clocked, i.e. clocked using a different clock speed than a common clock for the processor or SoC, or developed with different design methodologies. For example, in modern designs, the core logic of microprocessors run with gigahertz clocks. However, when input/output (I/O) and memory devices are incorporated on the same chip, these devices will require different clocking requirements. An example of a microprocessor or SoC design that includes asynchronous clock boundaries may be a 4 GHz processor that communicates with a 300 MHz input/output interface.

Similar asynchronous clock boundaries arise when different design methodologies are used in the same microprocessor or SoC. An example of chip elements designed using different methodologies may be a Generalized Scan Design (GSD) element that connects to a Level Sensitive Scan Design (LSSD) element. For example, GSD uses an edge triggered latch design with a single clock. LSSD uses a transparent latch design with a system clock and a B clock. Thus, during testing, only one clock is needed for GSD, yet two clocks are needed for LSSD. Moreover, since GSD uses edge triggered latches versus the transparent latches that are used in LSSD, the setup and hold times for these design methodologies are different. All of this gives rise to different clock boundaries conditions being present in the microprocessor or SoC design.

For a scan based designs, i.e. designs in which data is scanned through all of the latch elements in the scan chains of the various functional elements of the microprocessor or SoC, the different clocking requirements create asynchronous boundaries between the core logic and the other functional elements. Scanning across asynchronous clock boundaries is problematic because latch setup and hold times cannot be established reliably between the two clocking environments.

This is especially a problem when testing the operation of the microprocessor or SoC. During testing operations, the desire is to have all digital logic running on the same clock. This will allow the testing equipment to scan all latch elements to initialize the chip to a known state. This, however, is not possible with microprocessors or systems-on-a chip designs that have different clocking domains on the chip. As a result, during testing, the test equipment must treat each clock domain separately.

For scan based designs, one approach to addressing this issue is to design the clock distribution network such that both the native clock, i.e. the clock upon which a chip element operates, and a high speed common clock, also referred to as the system clock, are provided to the logic for asynchronous clock domains. Logic to implement a multiplexing scheme for the selection of clocking signals is provided on the chip to allow switching between the two clock domains. The high speed clock is used during scan operations to eliminate hazards when scanning across the asynchronous boundary. The native clock is used in a functional mode when the chip is operating.

This approach requires that all logic be timed at the fastest clock speed. For example, if the chip had 2 GHz and 300 MHz chip elements, the 300 MHz elements would need to be timed as 2 GHz elements to meet test requirements. Since they only need to run at 300 MHz functionally, this is not a very efficient design from a circuit area and power standpoint.

SUMMARY

The illustrative embodiments provide a system and method for testing an integrated circuit device with asynchronous clocks or dissimilar design methodologies. The system and method of the illustrative embodiments eliminate the requirement for scanning across asynchronous clock or dissimilar interface boundaries (hereafter simply referred to as "boundaries") during testing of the integrated circuit device, e.g., a microprocessor or system-on-a-chip (SoC). By eliminating the scanning across the boundaries, the requirement to have two clock grids in the asynchronously clocked domains may be eliminated. As a result, circuit area and design time with regard to the clock distribution design are reduced. In addition, removing the second clock grid, i.e. the high speed core or system clock, in the asynchronously clocked domains removes the requirement to have a multiplexing scheme for selection of clocking signals in the asynchronous domain.

In one illustrative embodiment, each clock domain in the integrated circuit device has dedicated scan-in and scan-out scan chain paths. In other words, the scan chain paths do not cross the boundaries between clock domains. The scan paths for each particular clock domain may have individual controls for each clock domain. Alternatively, common scan controls may be used for all clock domains. Since the scan paths do not cross the boundaries between clock domains, during scan tests, no scanning occurs between different clock domains.

In one illustrative embodiment, the boundaries on the integrated circuit device are bounded by scan latches. These scan latches may be loaded and held with known values, such as during an automatic test pattern generation (ATPG) testing process, a logic built-in-self-test (LBIST) or On-Product Multiple Input Signature Register (OPMISR) testing process. During such tests, functional captures may occur from one clock domain to the other however, no scanning across the boundary is allowed to occur.

Functional crossing logic is placed between the boundary scan latches. The functional crossing logic is tested by a boundary built-in-self-test (BIST). The boundary BIST may be run substantially simultaneously with an automatic built-in-self-test (ABIST) testing processing in order to reduce test time. The ABIST testing process operates on the arrays of the microprocessor or SoC. When the ABIST testing process runs, only the ABIST engine, the arrays, and a small amount of supporting logic are permitted to operate. All other logic is held while the ABIST testing process runs, as opposed to the LBIST testing process where all the logic on the microprocessor or SoC is permitted to run.

The boundary BIST is designed to test the functional crossing logic that connects logic in the two different clock domains, i.e. the synchronous and asynchronous clock domains, where synchronous and asynchronous are defined relative to a core or system clock. The boundary BIST is similar to ABIST in that it is a localized test. Just like ABIST, logic that is not associated with the boundary crossing function is held during the boundary BIST testing process. The nature of ABIST and boundary BIST makes it possible to run both tests at the same time.

During the boundary BIST and ABIST testing process, all logic on the chip is held, i.e. not clocked, except for the ABIST engines, the boundary BIST engines, boundary scan latch arrays, and boundary crossing logic. These elements participate in the scanning-in of known values to the boundary scan latches and the functional operations of the integrated circuit logic.

With the above arrangement, the scan chains in each individual domain may be used to test the proper operation of the circuit elements within that domain but do not provide information regarding the operation of the circuit elements in the boundary regions. The boundary BIST is utilized to test the logic at the boundary of the domains so as to ensure proper functioning of this boundary logic. Thus, with the mechanisms of the illustrative embodiments, all of the logic on the chip may be tested without having to perform scans across domain boundaries.

In one illustrative embodiment, a method for testing an integrated circuit device is provided. The method may comprise testing logic in a plurality of clock domains of the integrated circuit device using a plurality of scan chains provided in the integrated circuit device, wherein the scan chains do not cross asynchronous clock boundaries associated with the plurality of clock domains of the integrated circuit device. Boundary logic in the asynchronous clock boundaries associated with the plurality of clock domains of the integrated circuit device may be separately tested. An operation of the integrated circuit device may be verified based on results of the testing of the logic in the plurality of clock domains and testing of the boundary logic. The testing of the logic in the plurality of clock domains of the integrated circuit device may be performed while the integrated circuit device operates in a test mode of operation. The testing of the boundary logic may be performed while the integrated circuit device operates in a functional mode of operation.

Logic in each of the plurality of clock domains may be clocked using a native clock for that particular clock domain during the testing of the boundary logic. Logic in each of the plurality of clock domains may also be clocked using a native clock for that particular clock domain during the testing of the logic in the plurality of clock domains.

Testing the logic in the plurality of clock domains may comprise inputting test pattern data to scan-in scan chain paths of the plurality of scan chains of the integrated circuit device. Test output data may be captured at scan-out scan chain paths of the plurality of scan chains of the integrated circuit device.

There may be separate scan chains in each of the plurality of clock domains. In one illustrative embodiment, none of the scan chains may be present in more than one clock domain. The scan chains for each particular clock domain in the plurality of clock domains may have individual scan controls for each particular clock domain. Moreover, the scan chains for each particular clock domain in the plurality of clock domains may have a common scan control.

Separately testing boundary logic in the asynchronous clock boundaries associated with the plurality of clock domains of the integrated circuit device may comprise scanning in a test pattern data into first latches in a first clock domain of an asynchronous clock boundary and functionally passing the test pattern data from the first latches to second latches in a second clock domain of the asynchronous clock boundary. The test pattern data received in the second latches may be compared with expected test pattern data to verify operation of logic in the asynchronous clock boundary. Scanning-in of data across the asynchronous clock boundary may be prohibited during testing of the boundary logic.

The integrated circuit device may be a microprocessor or system-on-a-chip. The microprocessor or system-on-a-chip may be a heterogeneous multiprocessor system in which at least two processors operate using different instruction sets.

In other illustrative embodiments, a computer program product comprising a computer useable medium having a computer readable program is provided. The computer readable program, when executed on a computing device, causes the computing device to perform various ones, and combinations of, the operations outlined above with regard to the method illustrative embodiment.

In yet another illustrative embodiment, a system is provided for compiling source code for execution by one or more processors. The system may comprise a processor and a memory coupled to the processor. The memory may comprise instructions which, when executed by the processor, cause the processor to perform various ones, and combinations of, the operations outlined above with regard to the method illustrative embodiment.

In another illustrative embodiment, an integrated circuit device is provided. The integrated circuit device may comprise at least two clock domains having an asynchronous clock boundary between the at least two clock domains and a plurality of scan chains. A separate scan chain may be provided in each clock domain of the at least two clock domains. The separate scan chains may not cross the asynchronous clock boundary.

The integrated circuit device may further comprise a first set of scan latches provided on one side of an asynchronous clock boundary and a second set of scan latches provided on a second side of the asynchronous clock boundary. Logic in the at least two clock domains of an integrated circuit device may be tested using the plurality of scan chains while the integrated circuit device operates in a test mode of operation. Boundary logic in the asynchronous clock boundary may be separately tested by scanning in test pattern data to the first set of scan latches and functionally moving the test pattern data across the asynchronous clock boundary to the second set of scan latches. An operation of the integrated circuit device may be verified based on results of the testing of the logic in the at least two clock domains and testing of the boundary logic.

These and other features and advantages of the illustrative embodiments will be described in, or will become apparent to those of ordinary skill in the art in view of, the following detailed description of the illustrative embodiments.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference

DETAILED DESCRIPTION OF THE PREFERRED EMBODIMENTS

The illustrative embodiments provide a system and method for testing an integrated circuit device with asynchronous clocks or dissimilar design methodologies. As such, the illustrative embodiments may be utilized with any integrated circuit device in which there are different domains, e.g., a synchronous clock domain and an asynchronous clock domain, two different design methodology domains, or the like. In one illustrative embodiment, the mechanisms of the illustrative embodiments are implemented in a microprocessor chip or system-on-a-chip (SoC) and are utilized to test the proper functioning of the elements on the chip. In particular, in one illustrative embodiment the scan chains and boundary built-in-self-test (BIST) are applied to the Cell Broadband Engine (CBE) available from International Business Machines, Inc. of Armonk, N.Y. While the illustrative embodiments hereafter will be described with reference to the CBE, it should be appreciated that the present invention is not limited to application to the CBE but may be utilized with any integrated circuit device having heterogeneous domains.

Figure 1:
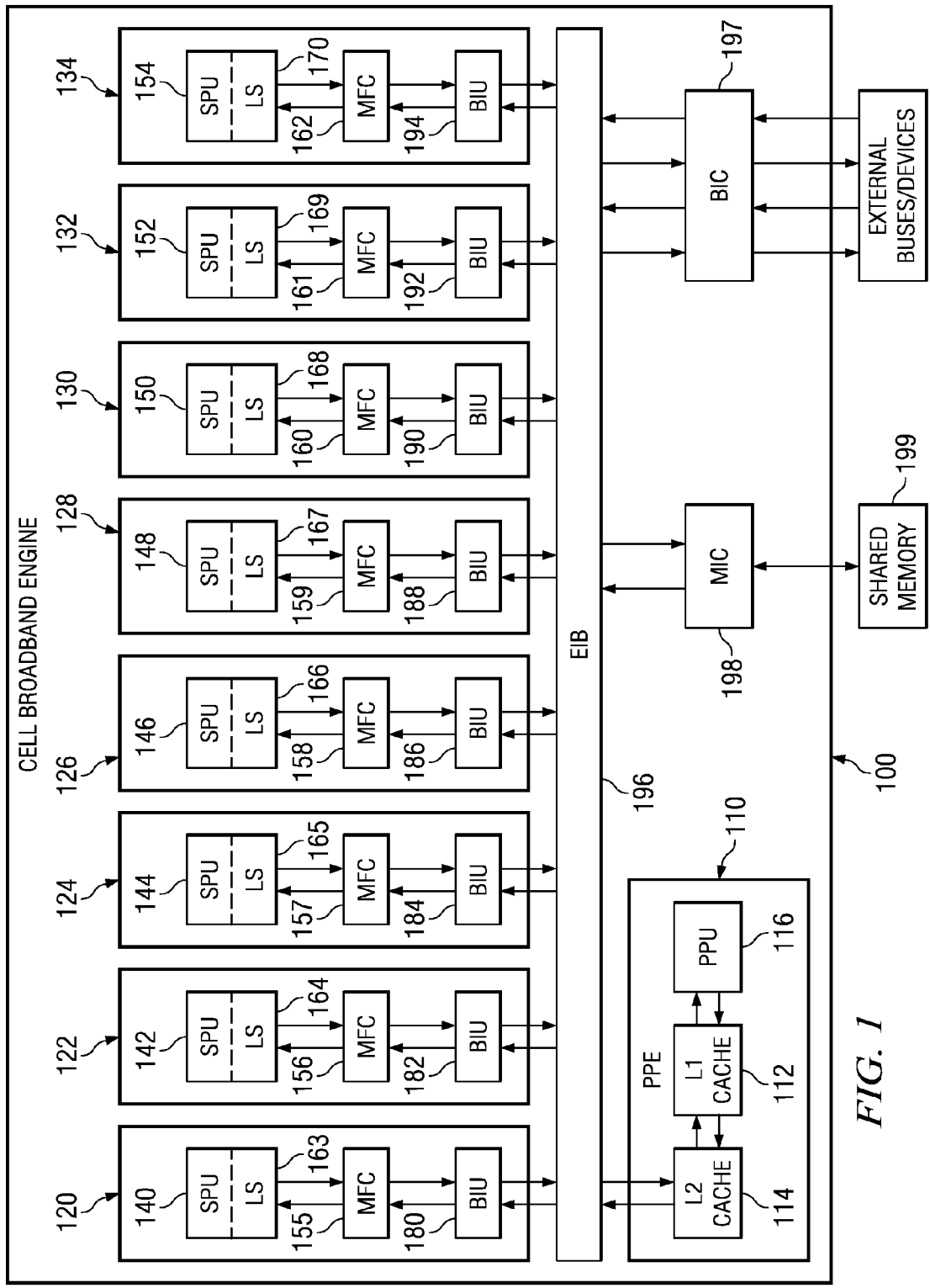
FIG. 1 is an exemplary block diagram of a data processing system in which aspects of the present invention may be implemented.

FIG. 1 is an exemplary block diagram of a data processing system in which aspects of the present invention may be implemented. The exemplary data processing system shown in FIG. 1 is an example of the Cell Broadband Engine (CBE) data processing system. While the CBE will be used in the description of the preferred embodiments of the present invention, the present invention is not limited to such, as will be readily apparent to those of ordinary skill in the art upon reading the following description.

As shown in FIG. 1, the CBE 100 includes a power processor element (PPE) 110 having a processor (PPU) 116 and its L1 and L2 caches 112 and 114, and multiple synergistic processor elements (SPEs) 120-134 that each has its own synergistic processor unit (SPU) 140-154, memory flow control 155-162, local memory or store (LS) 163-170, and bus interface unit (BIU unit) 180-194 which may be, for example, a combination direct memory access (DMA), memory management unit (MMU), and bus interface unit. A high bandwidth internal element interconnect bus (EIB) 196, a bus interface controller (BIC) 197, and a memory interface controller (MIC) 198 are also provided.

The CBE 100 may be a system-on-a-chip such that each of the elements depicted in FIG. 1 may be provided on a single microprocessor chip. Moreover, the CBE 100 is a heterogeneous processing environment in which each of the SPUs may receive different instructions from each of the other SPUs in the system. Moreover, the instruction set for the SPUs is different from that of the PPU, e.g., the PPU may execute Reduced Instruction Set Computer (RISC) based instructions while the SPU execute vectorized instructions.

The SPEs 120-134 are coupled to each other and to the L2 cache 114 via the EIB 196. In addition, the SPEs 120-134 are coupled to MIC 198 and BIC 197 via the EIB 196. The MIC 198 provides a communication interface to shared memory 199. The BIC 197 provides a communication interface between the CBE 100 and other external buses and devices.

The PPE 110 is a dual threaded PPE 110. The combination of this dual threaded PPE 110 and the eight SPEs 120-134 makes the CBE 100 capable of handling 10 simultaneous threads and over 128 outstanding memory requests. The PPE 110 acts as a controller for the other eight SPEs 120-134 which handle most of the computational workload. The PPE 110 may be used to run conventional operating systems while the SPEs 120-134 perform vectorized floating point code execution, for example.

The SPEs 120-134 comprise a synergistic processing unit (SPU) 140-154, memory flow control units 155-162, local memory or store 163-170, and an interface unit 180-194. The local memory or store 163-170, in one exemplary embodiment, comprises a 256 KB instruction and data memory which is visible to the PPE 110 and can be addressed directly by software.

The PPE 110 may load the SPEs 120-134 with small programs or threads, chaining the SPEs together to handle each step in a complex operation. For example, a set-top box incorporating the CBE 100 may load programs for reading a DVD, video and audio decoding, and display, and the data would be passed off from SPE to SPE until it finally ended up on the output display. At 4 GHz, each SPE 120-134 gives a theoretical 32 GFLOPS of performance with the PPE 110 having a similar level of performance.

The memory flow control units (MFCs) 155-162 serve as an interface for an SPU to the rest of the system and other elements. The MFCs 155-162 provide the primary mechanism for data transfer, protection, and synchronization between main storage and the local storages 163-170. There is logically an MFC for each SPU in a processor. Some implementations can share resources of a single MFC between multiple SPUs. In such a case, all the facilities and commands defined for the MFC must appear independent to software for each SPU. The effects of sharing an MFC are limited to implementation-dependent facilities and commands.

In the architecture described above, the SPEs 120-134 and PPE 110 operate in a synchronous clock domain, i.e. these processors are clocked using a common core or system clock. This common clock will typically be a high speed clock such that the SPEs 120-134 and PPE 110 may operate at high speeds, e.g., approximately 4 GHz or higher.

Figure 2:
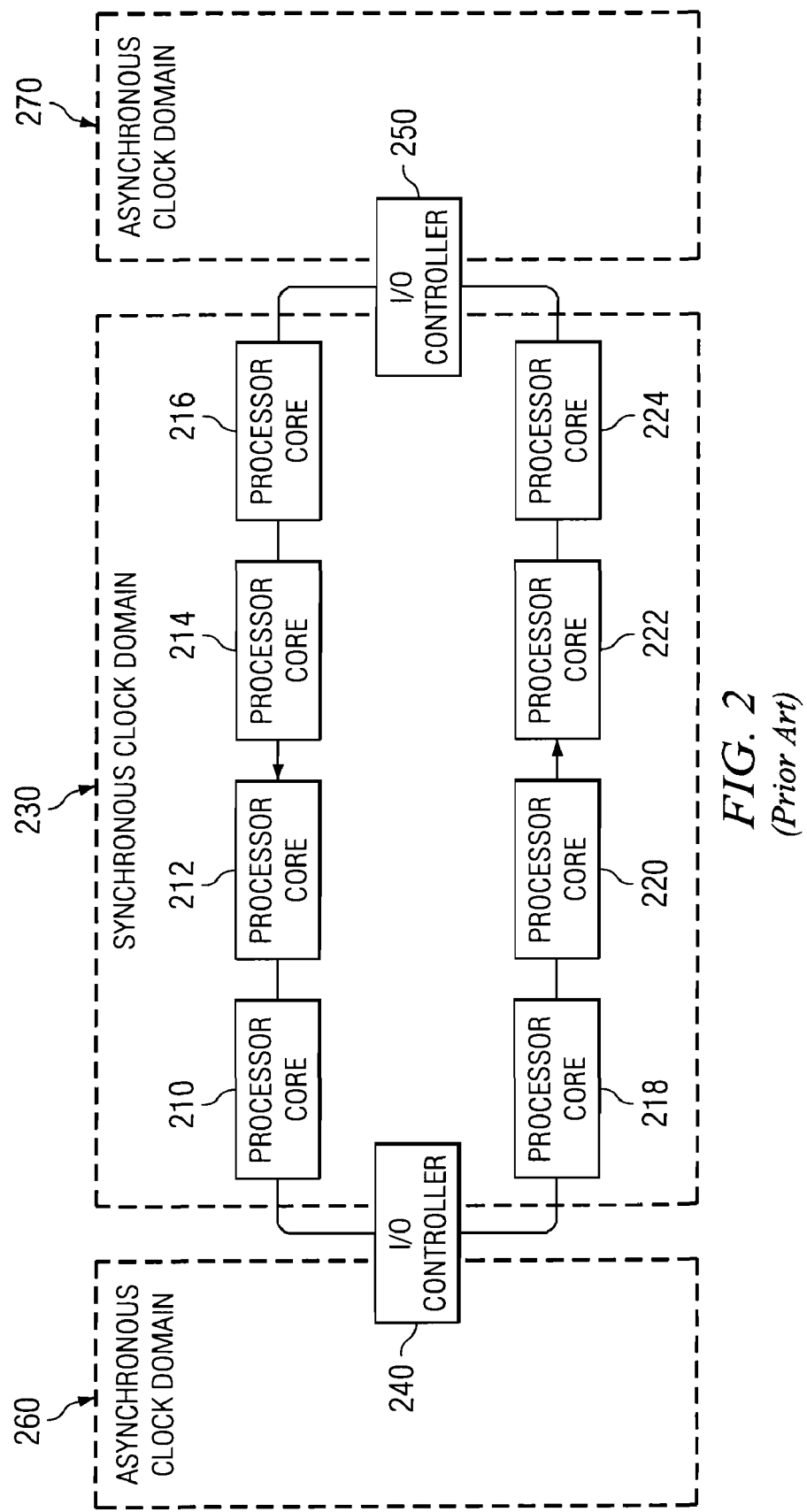
FIG. 2 illustrates a basic microprocessor or SoC diagram depicting the different synchronous and asynchronous clock domains in accordance with a known configuration.

The MIC 198 and BIC 197 typically must operate at a slower speed and thus, have their own native clocks. Thus, the MIC 198 and BIC 197 operate in an asynchronous clock domain, i.e. the native clock is asynchronous to the common core or system clock. As described previously, in known architectures, the clock distribution network in such asynchronous clock domains typically have both native and core clock distribution networks. Thus, the asynchronous domains have both asynchronous clock distribution networks and synchronous clock distribution networks so that these asynchronous domains may be properly tested. FIG. 2 illustrates a basic integrated circuit device which may be a microprocessor or SoC diagram depicting the different synchronous and asynchronous clock domains in accordance with a known configuration. As shown in FIG. 2, the microprocessor or SoC includes a plurality of processor cores 210-224 that are provided and operate in a synchronous clock domain 230. Coupled to these processor cores 210-224 are I/O controllers 240 and 250. The I/O controllers 240-250 operate in asynchronous clock domains 260 and 270. However, for testing purposes since it is desirable to have all portions of the SoC operating on the same common core or system clock, the I/O controllers 240, 250 further have synchronous I/O controls for operating in the synchronous clock domain as well.

In the example shown in FIG. 2, the processor cores 210-224 may be SPEs 120-134, a PPE 110, or the like, as shown in FIG. 1, for example. The I/O controllers 240 and 250 may be the MIC 198 and the BIC 197 of FIG. 1, for example. When the microprocessor or SoC is operating in a functional mode, the I/O controllers 240 and 250 operate using their native asynchronous clocks while the processor cores 210-224 operate using the common core or system clock. During testing of the microprocessor or SoC, all of the elements 210-224, 240 and 250 need to operate on the same clock. Thus, the I/O controllers 240 and 250 must switch their input clock from the native asynchronous clock to the synchronous common core or system clock. This is made possible through multiplexing logic provided in the clock distribution networks associated with the I/O controllers 240 and 250. This multiplexing logic along with the additional clock distribution network cause additional design time initially when the microprocessor or SoC is being designed and further because increased chip area usage due to the additional logic and wiring on the chip to provide these mechanisms.

The need to clock all of the elements 210-224, 240 and 250 with the same clock is primarily because of the scan chains used in typical integrated circuit chip designs. Scan chains typically cross the boundaries between domains, e.g., asynchronous clock domains or design methodology (interface) domains, in known integrated circuit chip designs. With asynchronous boundaries, or boundaries between different design methodologies and thus, different interfaces, when data patterns are scanned into the scan chains, if the domains are permitted to operate at their native clocks, it is not possible to reliably establish latch setup and hold times between the domains, i.e. across the boundaries. Thus, it is important that the boundaries essentially be eliminated during testing by forcing all of the domains to run based on the same common clock.

Figure 3:
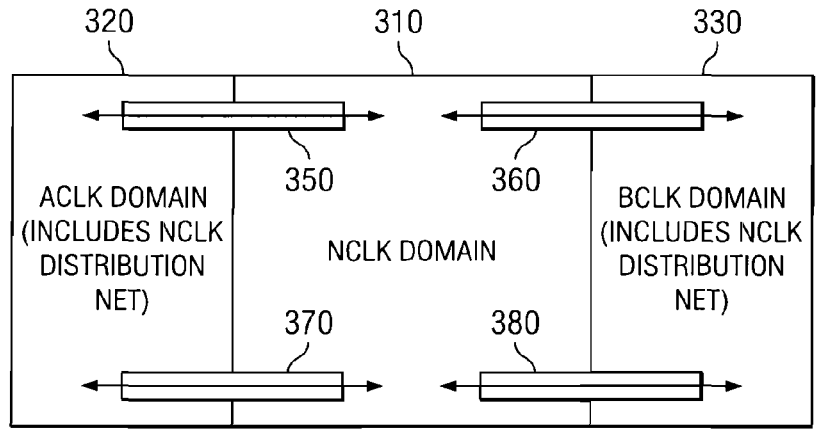
FIG. 3 is a conceptual diagram illustrating the known scan chain arrangement according to present design practice.

FIG. 3 is a conceptual diagram illustrating the known scan chain arrangement according to present design practice. As shown in FIG. 3, the scan chains 350-380 span both the synchronous core or system clock domain 310 (referred to in FIG. 3 as the "nclk" domain) and the asynchronous clock domains 320 and 330 (referred to in FIG. 3 as the "aclk" domain and the "bclk" domain). In one illustrative embodiment, the synchronous core or system clock domain 310 may correspond with the processor cores 210-224 of FIG. 2 and the asynchronous domains 320 and 330 may correspond to the I/O controllers 240 and 250 in FIG. 2, for example. As mentioned above, the asynchronous domains 320 and 330 further include multiplexing logic and clock distribution networks for providing the synchronous core or system clock (nclk) to the elements in the asynchronous domains 320 and 330 for testing purposes.

Because the scan chains 350-380 span the boundaries between the domains 310, 320 and 330, the entire microprocessor, SoC, etc., may be tested by scanning in a data pattern and detecting resulting outputs to determine if the integrated circuit device is operating properly. Even the boundary logic present at the boundary between the domains 310, 320, and 330 may be tested using such scan chains. However, in order to provide this ability, extra design effort and chip area utilization associated with the multiplexing logic and clock distribution networks in the asynchronous domains 320 and 330 is required. Furthermore, the logic in the asynchronous domains 320 and 330 must be designed such that they are able to operate at the synchronous core or system clock speed, which may be problematic, for example, when the synchronous core or system clock (nclk) has a higher frequency than the native clocks (aclk and bclk) for these domains 320 and 330. It is this extra design effort and chip area that the illustrative embodiments described herein seek to reduce.

Figure 4:
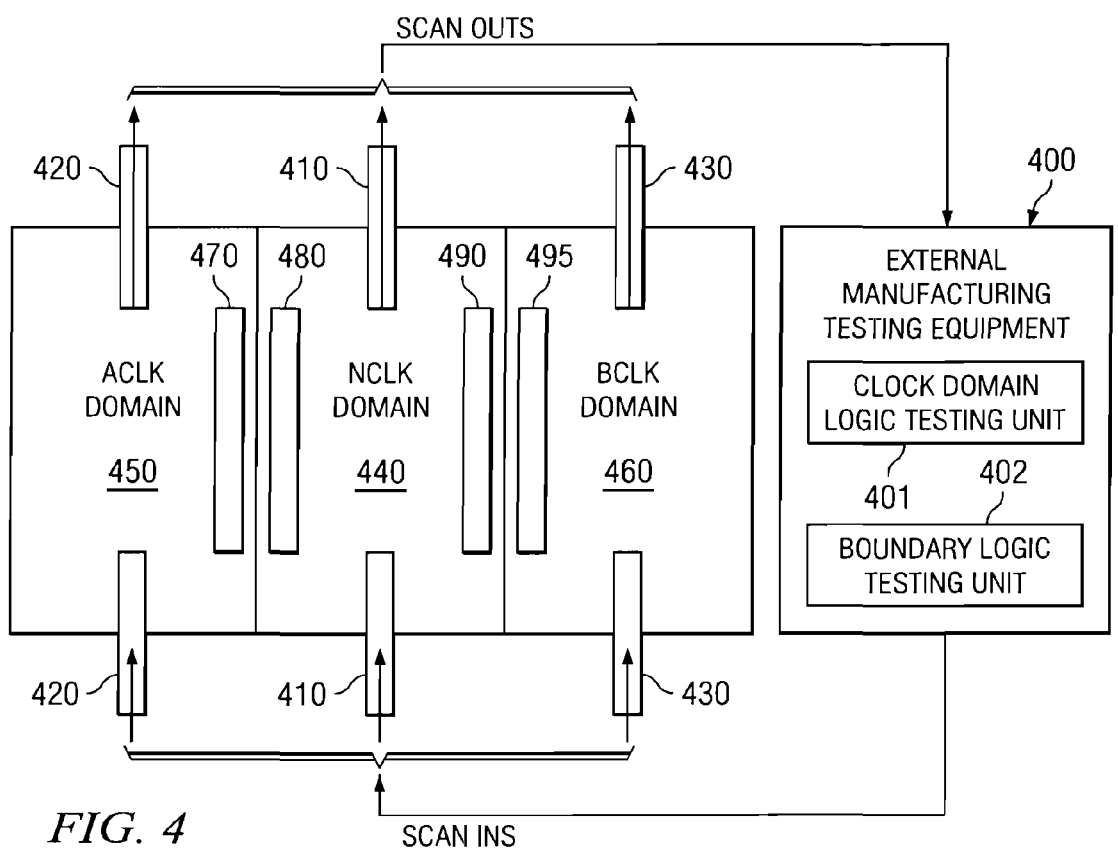
FIG. 4 is a conceptual diagram of the scan chains of an integrated circuit device in accordance with one illustrative embodiment.

FIG. 4 is a conceptual diagram of the scan chains of an integrated circuit device in accordance with one illustrative embodiment. As shown in FIG. 4, rather than the scan chains 410-430 crossing the boundaries between the synchronous core or system clock domain 440 and the asynchronous clock domains 450 and 460, the scan chains span a single clock domain and are not permitted to cross boundaries between clock domains 440-460. Thus, the synchronous core or system clock domain 440, hereafter referred to as the "nclk" domain 440, has its own dedicated scan chain 410 in which data patterns may be scanned into the nclk domain 440 via a scan-in path and resulting data output is generated via scan-out paths. Such data patterns may be scanned in as part of a scan test, an automatic test pattern generation (ATPG) test, or the like. Similarly, each of the asynchronous clock domains 450 and 460 have their own dedicated scan chains 420 and 430, respectively, through which data patterns may be scanned-in via scan-in paths and scanned out via scan-out paths.

These data patterns may be provided as part of various tests initiated and controlled by the external manufacturing testing equipment 400, for example (the term "external" as it is used herein refers to the equipment 400 being external to the integrated circuit device). The external manufacturing testing equipment 400 includes a clock domain logic testing unit 401 for performing tests on the integrated circuit device to test the logic in each of the separate clock domains via the scan chains 410-430. The external manufacturing testing equipment 400 may further include a boundary logic testing unit 402 that controls the performance of boundary logic tests in accordance with the illustrative embodiments, as described in greater detail hereafter. It should be appreciated that while FIG. 4 illustrates the tests of the integrated circuit device being initiated and controlled by external manufacturing testing equipment 400, the present invention is not limited to such. Rather, an on-chip testing unit may be provided that performs such tests and provides an indicator of whether or not the logic on the chip is operating properly to an external system, for example.

Each of the scan chains 410-430 may operate at the native clock for the clock domain in which the scan chain is present. Thus, the scan chain 410 operates based on the synchronous core or system clock, i.e. the nclk. The scan chain 420 in the asynchronous domain 450 operates based on the asynchronous clock aclk. The scan chain 430 in the asynchronous domain 460 operates based on the asynchronous clock bclk. Each of these scan chains 410-430 may have their own individual scan controls, i.e. signals that are used to "control" the test logic to thereby inform the test logic of the desired operating state (e.g., the control signal "scan enable" signifies that the logic should operate in its scan mode). Alternatively, common scan controls could be used for all domains.

Since the scan chains 410-430 do not cross the boundaries between clock domains 440-460, it is not necessary that the asynchronous clock domains 450 and 460 include multiplexing logic or additional synchronous core or system clock distribution networks. As a result, the design effort for the asynchronous clock domains 450 and 460, as well as the chip area utilization, is reduced. One drawback of this approach, however, is that the scan chains 410-430 do not exercise the boundary logic at the boundaries of the clock domains 440-460.

In order to be able to test the different clock domain logic, the boundaries between clock domains 440-460 are bounded by scan latches 470-495. The scan latches 470-495 allow known values to be loaded during the testing process.

The boundaries are tested while the integrated circuit device operates in a functional mode with each clock domain running on its own native clock. Functional logic may be provided between the boundary scan latches 470-495 and data values may be transferred across the boundaries from the scan latches in one clock domain to the scan latches in another clock domain using this functional logic.

One or more tests, e.g., a logic built-in-self-test (LBIST) and On-Product Multiple Input Signature Register (OP-MISR) test, may be performed to test the logic of the integrated circuit device after scanning in known values into scan latches 470-495 at the boundaries. The LBIST test process includes scanning pseudo random patterns into the scan chains and then running functional cycles to exercise the logic. LBIST alternates between scan and functional cycles for many cycles. When scanning, the data goes into a Multiple Input Signature Register (MISR) to create a signature. The LBIST pattern generation is done with logic on the chip. OPMISR is similar to LBIST with the exception that the pattern generation and control of scanning is done by external manufacturing testing equipment. During these tests, no scanning across the boundaries is permitted.

Array built-in-self test (ABIST) and boundary built-in-self-test (BBIST) are used to test the circuits that are not tested with LBIST, OPMISR, or Automated Test Pattern Generation (ATPG). The ABIST test generates test patterns that are written and read into the arrays of the microprocessor or SoC. The read data is compared to the generated data to determine if the array is operating properly. The boundary BIST, as will be described hereafter, functionally exercises the boundary latches and logic in the boundary between clock domains to verify it is operating properly. These tests may be run simultaneously to reduce test time.

Figure 5:
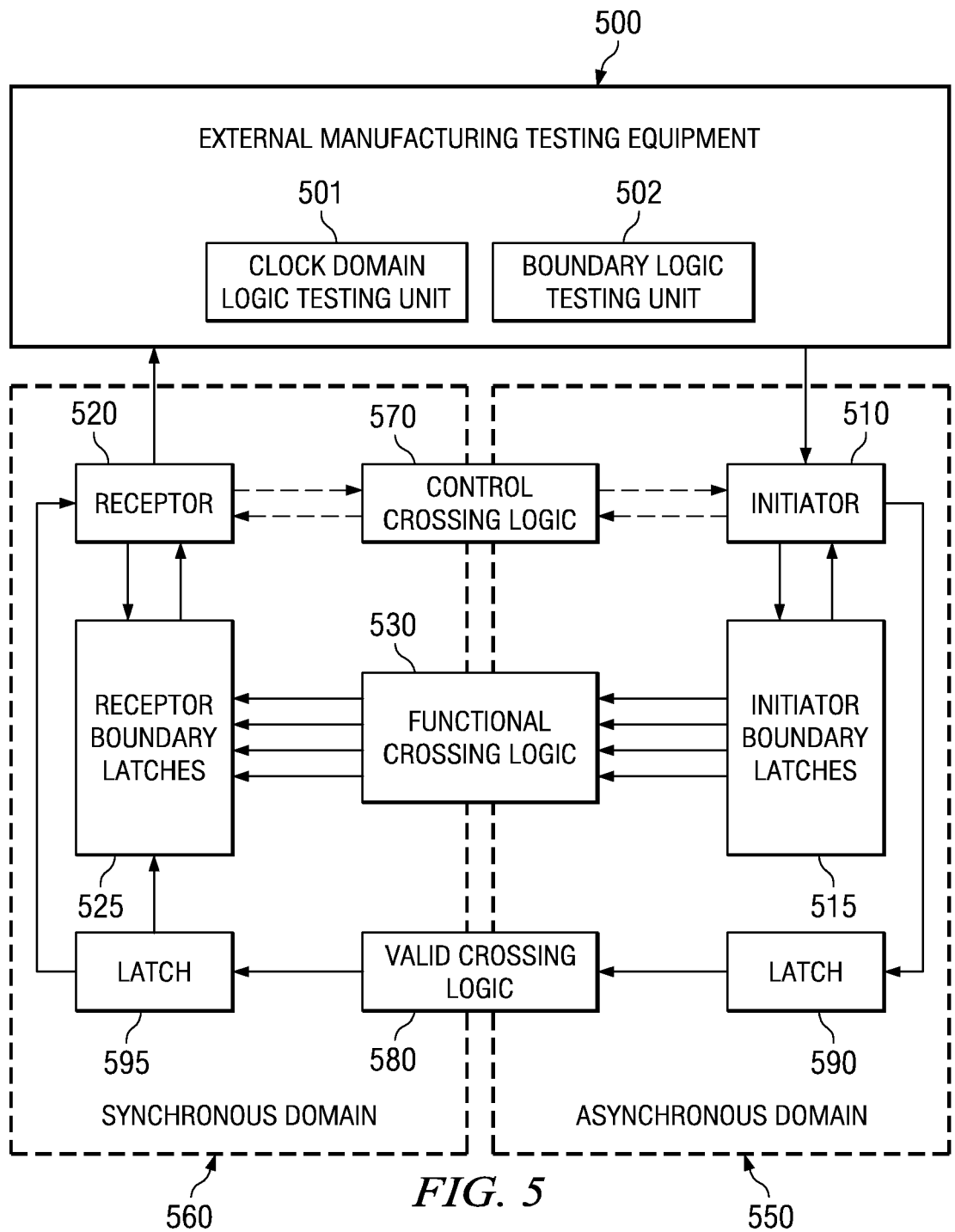
FIG. 5 is an exemplary diagram illustrating the primary operational components for performing a boundary BIST in accordance with one illustrative embodiment.

During these tests, all logic on the integrated circuit device is held, i.e. not clocked, except for the ABIST engine (not shown), the boundary BIST engine (not shown), the scan latches 470-495, and the functional boundary crossing logic. These elements are permitted to operate in a functional mode so as to test the functional boundary crossing logic. During these tests, all elements that are permitted to operate during these tests are clocked by their native clocks. Thus, the synchronous clock clocks synchronous elements and the asynchronous clocks clock asynchronous elements. FIG. 5 is an exemplary diagram illustrating the primary operational components for performing a boundary BIST in accordance with one illustrative embodiment. As shown in FIG. 5, the key components for performing a boundary BIST are an initiator 510 and a receptor 520. The initiator 510 generates a stimulus that drives the boundary interface, i.e. the initiator boundary scan latches 515, the functional crossing logic 530, and the receptor boundary scan latches 525, while the receptor 520 is used to capture the data that crosses the boundary interface and generates a signature based on the captured data. This signature may then be compared to the data signature that is expected to be received at the receptor 520 based on the stimulus generated by the initiator 510 to determine if the functional crossing logic 530 is operating properly.

The initiator 510 and the receptor 520 may interface with external manufacturing testing equipment 500 in order to receive inputs to begin testing of the integrated circuit device and provide outputs of results of such tests. As shown in FIG. 5, the external manufacturing testing equipment 500 may include clock domain logic testing unit 501 and boundary logic testing unit 502. The boundary logic testing unit 502 may communicate with the initiator 510 to initiate a boundary BIST and may communicate with the receptor 520 to receive signature data for comparison to expected data, for example. Again, while FIG. 5 shows an external manufacturing testing equipment 500 initiating tests and determining results of tests, the present invention is not limited to such. Rather, an on-chip testing unit may be provided that performs such operations completely on-chip while providing an output indicative of results of such testing to an external system, for example.

The initiator boundary scan latches 515 and the receptor boundary scan latches 525 may be the boundary scan latches referenced in FIG. 4 above. For example, the initiator boundary scan latches 515 may be equivalent to the boundary scan latches 480 in FIG. 4 while the receptor boundary scan latches 525 may be equivalent to the boundary scan latches 470 in FIG. 4. Alternatively, the initiator boundary scan latches 515 may be equivalent to the boundary scan latches 495 in FIG. 4 and the receptor boundary scan latches 525 may be equivalent to the boundary scan latches 490 in FIG. 4, for example.

In the depicted example, the initiator 510 is in a first domain 550 and the receptor 520 is in a second domain 560. The first domain 550 or the second domain 560 may be either of a synchronous clock domain or an asynchronous clock domain, for example. If the first domain 550 is an asynchronous clock domain, then the second domain 560 is a synchronous clock domain, for example. Alternatively, the two domains 550 and 560 may be based on two different design methodologies and thus, may have different interfaces.

Since the initiator 510 and the receptor 520 are in two different domains 550 and 560, and thus, may operate using different native clocks and/or design methodologies, it is necessary that there be some control crossing logic 570 and valid bit crossing logic 580 to enable the initiator 510 to inform the receptor 520 when a boundary BIST has been initiated and when valid data is present in the receptor boundary scan latches 525. Otherwise, the receptor 520 will not know when to extract valid test data from the receptor boundary scan latches 525 for the generation of a signature to validate the operation of the functional crossing logic 530.

The control crossing logic 570 is used by the initiator 510 to send control signals to the receptor 520. These control signals may inform the receptor 520 of the start or stop of a boundary BIST, for example. The control signals may further include signals and information needed by the receptor 520 to perform various functions during the boundary BIST. For example, the control signals may include a "clear register" control signal to inform the receptor 520 to clear its signature register so that a new signature may be captured and used to verify operation of the functional crossing logic 530. The control crossing logic 570 may further be used by the receptor 520 to send acknowledgment signals and other control signals need for communicating with the initiator 510 so as to perform a boundary BIST.

The valid bit crossing logic 580 is used by the initiator to send a valid bit to the receptor boundary scan latches 525 and the receptor 520 to capture test data into the receptor boundary scan latches 525 and to inform the receptor 520 of when valid test data is present in the receptor boundary scan latches 525. The valid bit is passed up the chain of scan latches in the receptor boundary scan latches 525 with the scan latches capturing inputs from the functional crossing logic 530 in response to receiving the valid bit. The valid bit is also input to the receptor 520. In response to receiving the valid bit, the receptor 520 knows that valid test data is present in the receptor boundary scan latches 525. Moreover, as the valid bit is passed through the chain of receptor boundary scan latches 525, the receptor boundary scan latches 525 capture output data values from the functional crossing logic 530 and output them to the receptor 520.

Thus, the reception of the valid bit in the receptor 520 and the receptor boundary scan latches 525 causes the receptor 520 to capture valid test data from the functional crossing logic 530 via the receptor boundary scan latches 525. The receptor 520 generates a data signature based on the output from the receptor boundary scan latches 525 and stores it in a register within the receptor 520 or otherwise associated with the receptor 520.

Thus, in operation, the initiator 510 receives inputs from external testing equipment (not shown) instructing the initiator 510 to initiate a boundary BIST. The initiator 510 may send an appropriate control signal across the asynchronous boundary via the control crossing logic 570 to inform the receptor 520 that a boundary BIST has been initiated. The initiator 510 may include a counter, or other element, for generating a pattern of input data values to be scanned into the initiator boundary scan latches 515.

The initiator boundary scan latches 515 have an output to the initiator 510 that indicates when the boundary scan latches 515 have been properly aligned with the values of the input data pattern generated by the initiator 510. In response to receiving the output from the initiator boundary scan latches 515, the initiator 510 generates a valid bit that is output to a latch 590. In addition, the initiator 510 causes the initiator boundary scan latches 515 to output their values to the functional crossing logic 530.

While the values of the input data pattern generated by the initiator 510 are being operated on by the functional crossing logic 530, the valid bit is output to the valid crossing logic 580. The valid crossing logic 580 operates across the asynchronous boundary in a similar manner as the function crossing logic 530, Thus, the valid bit should arrive at the recptor boundary scan latches 525 at substantially a same time as when valid test data is available to be captured by the receptor boundary scan latches 525 from the outputs of the functional crossing logic 530.

As discussed above, when the valid bit is received in latch 595, it is output to the receptor 520 and the receptor boundary scan latches 525. In response to receiving the valid bit, the receptor boundary scan latches 525 capture output values from the functional crossing logic 530 and output the values to the receptor 520. The receptor 520 captures these outputs and generates a data signature which is stored in an associated register. Depending on the design, additional staging latches may be needed in the path of latch 595 to the receptor 520. External testing equipment may extract the data signature from the register and compare it to an expected data signature for properly functioning functional crossing logic 530. If the signatures match, then it is determined that the functional crossing logic 530 is operating properly. If the signatures do not match, then it may be determined that the functional crossing logic 530 is not operating properly. Such information may be logged and/or used as a basis for generating notifications to a human designer so that proper correction of the functional crossing logic 530 may be performed.

In the above described illustrative embodiment, the functional crossing logic 530 may be any type of logic that is used to synchronize the operation of circuit elements in two different domains. For example, the functional crossing logic 530 may be back to back latches, a First-In-First-Out (FIFO) array, or other type of arrays. For each of these cases, the initiator 510 and receptor 520 may be different. For example, for the back to back latches case, the initiator 510 and receptor 520 may be linear feedback shift registers (LFSR). Alternatively, the initiator 510 may be a LFSR while the receptor 520 is a Multiple Input Signature Register (MISR). On the other hand, in the case that the functional crossing logic 530 is a FIFO or other type of array, an array built-in-self-test (ABIST) engine having a pattern generator may be utilized as the initiator 510 while the receptor 520 may comprise compare logic.

It should be appreciated that the illustrative embodiments may further be implemented in a parallel fashion in which the initiator 510 and the receptor 520 may both send and receive data to parallel ports of the boundary scan latches 515 and 525. That is, rather than using a serial method to load and unload boundary latches as shown in FIG. 5, a parallel approach may be utilized. If a parallel approach is used, the initiator 510 may drive all bits on the boundary latches in parallel. Likewise, the receptor 520 may receive all the outputs in parallel. Such a parallel implementation may result in additional logic and wire utilization, but would provide the benefit of a shorter test time. For example, if the interface was 32-bits wide, a parallel approach could check all 32-bits in one cycle. A serial approach would require 32 clock cycles because only one bit is checked every cycle.

Thus, the illustrative embodiments provide a mechanism for testing the operation of an integrated circuit device in which there are asynchronous or design methodology boundaries without requiring additional clock switching logic and clock distribution networks. Each domain in the integrated circuit device may be tested at its own native clock with its own dedicated scan chains that do not cross boundaries on the integrated circuit device. The functional crossing logic of the boundaries of the integrated circuit device may be tested in a functional mode of operation using a boundary BIST engine comprising an initiator, a receptor, boundary scan latches, control crossing logic, and valid bit crossing logic. As a result, the illustrative embodiments reduce the amount of design time associated with designing clock distribution networks and clock switching logic. Moreover, the illustrative embodiments reduce the amount of chip area utilization by eliminating the need for additional clock distribution networks and clock switching logic.

It should be appreciated that while the above illustrative embodiments have been described as being implemented in a physical integrated circuit device, the mechanisms of the illustrative embodiments may be implemented virtually in a computing device as well. For example, as part of the design process of an integrated circuit device, such as a microprocessor or system-on-a-chip (SoC), after the design is complete, the design may be virtually tested using a testing program that simulates the mechanisms of the illustrative embodiment described above. Thus, the illustrative embodiments may be implemented in a computer readable program that, when executed by a computing device, cause the computing device to perform various operations to simulate or emulate the operation of the integrated circuit device, the scan chains, the boundary BIST engine, and the like, as described above.

Figure 6:
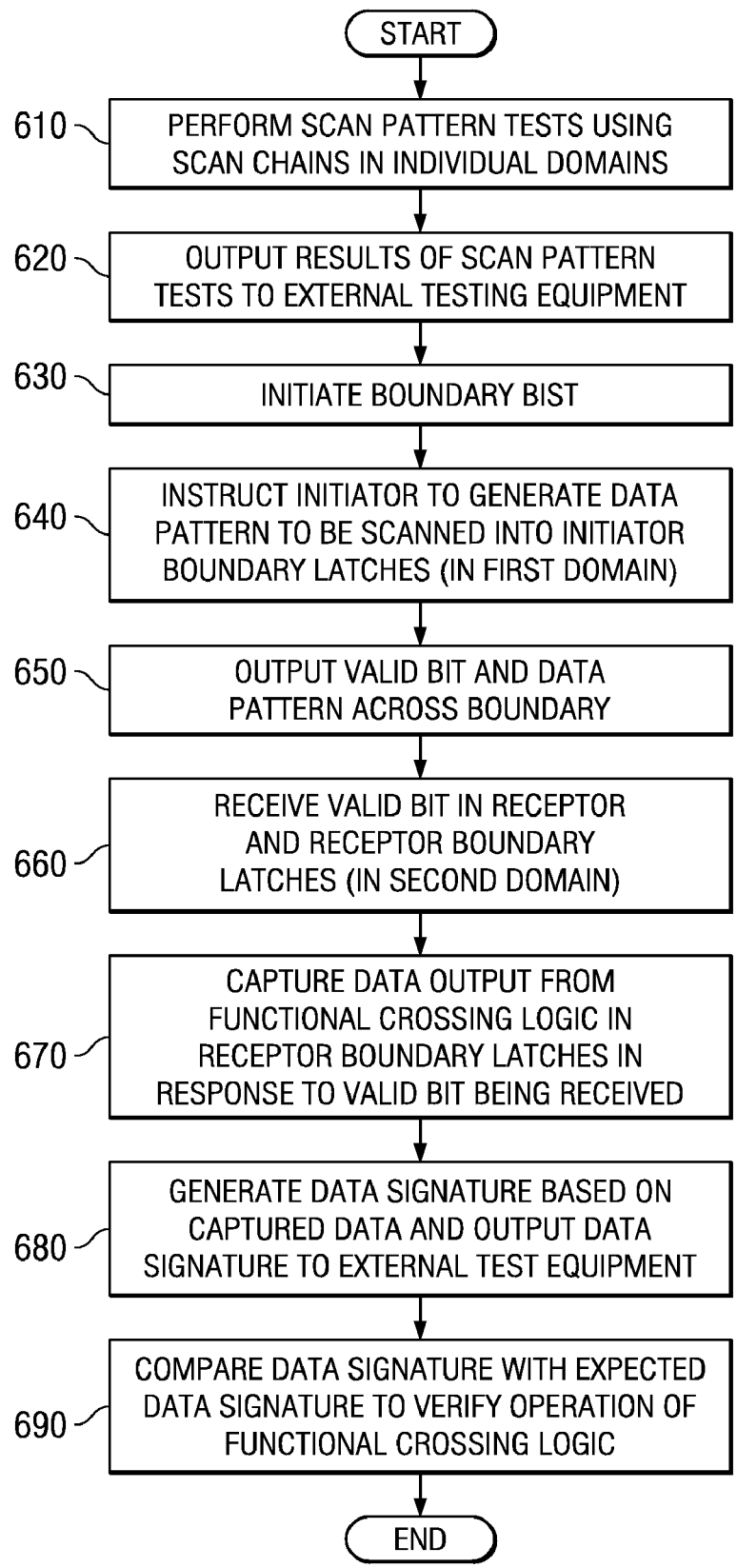
FIG. 6 is a flowchart outlining an exemplary operation of one illustrative embodiment when testing the operation of an integrated circuit device.

FIG. 6 is a flowchart outlining an exemplary operation of one illustrative embodiment when testing the operation of an integrated circuit device. It will be understood that each block of the flowchart illustration, and combinations of blocks in the flowchart illustration, can be implemented by computer program instructions. These computer program instructions may be provided to a processor or other programmable data processing apparatus to produce a machine, such that the instructions which execute on the processor or other programmable data processing apparatus create means for implementing the functions specified in the flowchart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustration support combinations of means for performing the specified functions, combinations of steps for performing the specified functions and program instruction means for performing the specified functions. It will also be understood that each block of the flowchart illustration, and combinations of blocks in the flowchart illustration, can be implemented by special purpose hardware-based computer systems which perform the specified functions or steps, or by combinations of special purpose hardware and computer instructions.

As shown in FIG. 6, the operation starts by external test equipment, i.e. external to the integrated circuit device being tested, performing scan pattern tests on the synchronous and asynchronous domains using the scan chains built into the integrated circuit device (step 610). As discussed above, these scan pattern tests are used to test the logic within each domain individually and do not test the logic in the boundaries between domains. Thus, the scan pattern tests are performed with each domain being run at its own native clock. Results of the scan pattern tests are output by the integrated circuit device to the external testing equipment so that the results may be used to identify problems or areas where redesign of the integrated circuit device may be required or desirable (step 620).

The external test equipment then initiates a boundary built-in-self test is then initiated (step 630). An initiator is instructed, by the external test equipment, to generate a data pattern to be scanned into initiator boundary latches of a domain boundary (step 640). The initiator sends a valid bit across the boundary while the data pattern is output to functional crossing logic of the boundary (step 650). A receptor and receptor boundary latches receive the valid bit at substantially a same time as a set of data is output by the functional crossing logic (step 660). In response to receiving the valid bit, the receptor boundary latches capture the output data from the functional crossing logic and provide the captured data to the receptor (step 670). The receptor generates a data signature based on the capture data and outputs the data signature to the external test equipment (step 680). The external test equipment compares the data signature to an expected data signature based on the generated input data pattern to determine if the functional crossing logic is operating properly (step 690). The operation then terminates.

Thus, the illustrative embodiments provide a mechanism by which an integrated circuit device may be tests without having to scan data patterns across asynchronous boundaries. The boundary crossing logic is tested in a functional mode using a boundary BIST mechanism. In this way, design time and chip area are reduced by eliminating the need to design and include synchronous clock distribution networks and clock switching logic in the asynchronous clock domains.

The circuit arrangement as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor. Moreover, the end products in which the integrated circuit chips may be provided may include game machines, game consoles, hand-held computing devices, personal digital assistants, communication devices, such as wireless telephones and the like, laptop computing devices, desktop computing devices, server computing devices, or any other computing device.

It should further be noted that, in at least one illustrative embodiment, external manufacturing testing equipment may be provided for initiating the testing of the integrated circuit device and analyzing results of the testing to determine if the integrated circuit device logic is operating properly. The operation of such external manufacturing testing equipment, as well as some elements of the integrated circuit device itself, e.g., the initiator and receptor, may be programmed to execute a computer readable program. The computer readable program, in some illustrative embodiments, may take the form of a computer program product accessible from a computer-usable or computer-readable medium providing program code for use by or in connection with a computer or any instruction execution system. For the purposes of this description, a computer-usable or computer readable medium may be any apparatus that may contain, store, communicate, propagate, or transport the program for use by or in connection with the instruction execution system, apparatus, or device.

The medium may be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk—read only memory (CD-ROM), compact disk—read/write (CD-R/W) and DVD.

A data processing system, such as the external manufacturing testing equipment, suitable for storing and/or executing program code will include at least one processor coupled directly or indirectly to memory elements through a system bus. The memory elements may include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) may be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method for testing an integrated circuit device, wherein the integrated circuit device comprises logic in a plurality of clock domains and logic in asynchronous boundaries associated with the plurality of clock domains, the method comprising:

performing an array built-in self test to test logic in a plurality of clock domains of the integrated circuit device using a plurality of scan chains provided in the integrated circuit device, wherein the scan chains do not cross asynchronous clock boundaries associated with the plurality of clock domains of the integrated circuit device, wherein logic in each of the plurality of clock domains is clocked using a native clock for that particular clock domain during the testing of the logic in the plurality of clock domains and wherein testing the logic in the plurality of clock domains comprises inputting test pattern data to scan-in scan chain paths of the plurality of scan chains of the integrated circuit device and capturing test output data at scan-out scan chain paths of the plurality of scan chains of the integrated circuit device;

performing a boundary built-in self test to separately test boundary logic in the asynchronous clock boundaries associated with the plurality of clock domains of the integrated circuit device, wherein the logic in each of the plurality of clock domains is clocked using the native clock for that particular clock domain during the testing of the boundary logic, wherein separately testing boundary logic in the asynchronous clock boundaries associated with the plurality of clock domains of the integrated circuit device comprises scanning in a test pattern data into first latches in a first clock domain of an asynchronous clock boundary, functionally passing the test pattern data from the first latches to second latches in a second clock domain of the asynchronous clock boundary, passing a valid bit to valid crossing logic, receiving the valid bit at a receptor in the second clock domain, responsive to receiving the valid bit at the receptor, capturing values at the second latches in the second clock domain, generating a data signature based on the values captured at the second latches, storing the data signature, and comparing the data signature with an expected data signature to verify operation of logic in the asynchronous clock boundary, and wherein scanning-in of data across the asynchronous clock boundary is prohibited during testing of the boundary logic; and verifying an operation of the integrated circuit device based on results of the testing of the logic in the plurality of clock domains and testing of the boundary logic, wherein the integrated circuit device is a microprocessor or system-on-a-chip, wherein the microprocessor or system-on-a-chip is a heterogeneous multiprocessor system in which at least two processors operate using different instruction sets; and wherein the array built-in self test is performed while the integrated circuit device operates in a test mode of operation, and wherein the boundary built-in self test is performed while the integrated circuit device operates in a functional mode of operation.

* * * * *